United States Patent
Warren et al.

[11] Patent Number: 6,159,829
[45] Date of Patent: Dec. 12, 2000

[54] MEMORY DEVICE USING MOVEMENT OF PROTONS

[76] Inventors: William L. Warren, 900 N. Randolph St., Arlington, Va. 22203; Karel J. R. Vanheusden, 8401 Spain Rd.; Daniel M. Fleetwood, 5513 Estrellita del Norte, NE., both of Albuquerque, N. Mex. 87111; Roderick A. B. Devine, 12 Impasse de la Liberation, 38950 St. Martin le Vinoux, France; Leo B. Archer, 3108 Vicky Ct., Garland, Tex. 75044; George A. Brown, 1512 Ridgeview Dr., Arlington, Tex. 76012-1940; Robert M. Wallace, 428 Park Bend Dr., Richardson, Tex. 75081

[21] Appl. No.: 09/064,488

[22] Filed: Apr. 22, 1998

Related U.S. Application Data

[63] Continuation-in-part of application No. 08/714,547, Sep. 16, 1996, Pat. No. 5,830,575.
[60] Provisional application No. 60/045,035, Apr. 28, 1997, and provisional application No. 60/065,604, Nov. 18, 1997.

[51] Int. Cl.[7] .................................................. H01L 21/425
[52] U.S. Cl. .......................... 438/530; 438/289; 438/542; 438/257
[58] Field of Search ................................... 438/289, 530, 438/542, 257

[56] References Cited

U.S. PATENT DOCUMENTS

| | | | |
|---|---|---|---|
| 4,035,718 | 7/1977 | Chandler | 324/0.5 G |
| 4,322,881 | 4/1982 | Enomoto et al. | 29/571 |
| 4,794,565 | 12/1988 | Wu et al. | 365/185 |
| 5,021,848 | 6/1991 | Chiu | 357/23.5 |
| 5,053,842 | 10/1991 | Kojima | 357/23.5 |
| 5,115,288 | 5/1992 | Manley | 357/23.5 |
| 5,241,202 | 8/1993 | Lee | 257/315 |
| 5,267,194 | 11/1993 | Jang | 365/185 |
| 5,280,213 | 1/1994 | Day | 310/302 |
| 5,402,374 | 3/1995 | Tsuruta et al. | 365/185 |
| 5,477,050 | 12/1995 | Kronenberg et al. | 250/336.1 |
| 5,483,487 | 1/1996 | Sung-Mu | 365/185.33 |
| 5,554,553 | 9/1996 | Harari | 437/43 |
| 5,578,846 | 11/1996 | Evans, Jr. et al. | 257/295 |
| 5,586,039 | 12/1996 | Hirsch et al. | 364/468.01 |
| 5,587,332 | 12/1996 | Chang et al. | 437/43 |
| 5,656,544 | 8/1997 | Bergendahl et al. | 438/386 |
| 5,830,575 | 11/1998 | Warren et al. | 428/404 |

OTHER PUBLICATIONS

Vanheusden, K., et al., Non–Volatile Memory Device Based On Mobile Protons In $SiO_2$ Thin Films, *Nature*, Apr. 10, 1997, vol. 386, p. 587.

*Primary Examiner*—Nam Nguyen
*Assistant Examiner*—Steven H. Ver Steeg
*Attorney, Agent, or Firm*—David Denker; Wade James Brady, III; Frederick J. Telecky, Jr.

[57] ABSTRACT

An enhancement of an electrically written memory element utilizing the motion of protons within a dielectric layer surrounded by layers on either side to confine the protons within the dielectric layer with electrode means attached to the surrounding layers to change the spatial position of the protons within the dielectric layer. The device is preferably constructed as a silicon-silicon dioxide-silicon layered structure with the protons being introduced to the structure during an anneal in an atmosphere containing hydrogen gas. Device operation is enhanced by concluding this anneal step with a sudden cooling. The device operates at low power, is preferably nonvolatile, is radiation tolerant, and is compatible with convention silicon MOS processing for integration with other microelectronics elements on the same silicon substrate.

15 Claims, 4 Drawing Sheets

MEMORY DEVICE USING MOVEMENT OF PROTONS

This application is a continuation-in-part of application 08/714,547 filed Sep. 16, 1996—now issued as U.S. Pat. No. 5,830,575. This application claims priority from provisional applications 60/045,035, filed Apr. 28, 1997 and 60/065,604, filed Nov. 18, 1997.

This invention was made with Government support under Contract DE-AC04-94AL85000 awarded by the U.S. Department of Energy. The Government has certain rights in the invention.

BACKGROUND OF THE INVENTION

This invention relates to an extension of an electronic memory mechanism involving the movement of protons (hereinafter hydrogenous ions) within a dielectric layer. The memory mechanism may manifest as a static random access memory, a dynamic random access memory, a nonvolatile memory, an optical memory, or as a flat panel display. The memory elements are most readily constructed in silicon-based structures.

There is a wide variety of structures that can act as memory elements. Each has its own advantages and disadvantages. The ubiquitous dynamic random access memories (DRAM) have high capacities, relatively low cost, and fast access times but are subject to upsets from radiation and other mechanisms and require refresh and rewrite circuits. Static RAMs require more circuitry and also are subject to upsets. Flash and silicon-nitride based (SONOS) nonvolatile memories have good access times and endurance but require high (12–15V) programming voltages. EEPROM nonvolatile memories have similar characteristics. Ferroelectric memories are incompatible with silicon processing but are otherwise attractive nonvolatile memories.

SUMMARY OF THE INVENTION

The basic mechanism is an extension of U.S. patent application Ser. No. 08/714,547—now issued as U.S. Pat. No. 5,830,575—titled Memory Device Using Movement of Protons, by Warren, et al. In both this and the '547 application, the basic mechanism exploited is the movement of ions containing a single proton (hydrogen+, deuterium+, and tritium+—hereinafter hydrogenous ions) within a dielectric layer contained between two semiconducting or conducting layers which present interfacial layers that tend to prevent the ions from escaping. An electric field is applied reversibly across the dielectric layer to change the spatial position of the hydrogenous ions within the dielectric layer. The position of the hydrogenous ions remains the same and endures unless intentionally moved by the application of a reversed electric field, across the dielectric layer. Since the positively charged protons cause a positive electric field, their spatial position within the dielectric layer can be used to form a memory element. In this patent, we disclose a method of enhancing this effect by using a sudden cooling step during the formation of a device.

When implemented as a microelectronic memory, silicon dioxide is a preferred material for the dielectric layer. The hydrogenous ions are introduced into the dielectric layer either by a high temperature anneal in a hydrogenous gas atmosphere, where the anneal ends with a sudden cooling, or by implanting hydrogenous ions directly into the dielectric layer. The layers and/or layer interfaces above and below the dielectric layer comprise a material system that is highly impervious to the migration of the hydrogenous ions. Preferably, this material system includes a poly or single crystalline silicon next to a silicon dioxide dielectric layer. Electrodes are associated with the layers above and below the dielectric layer to create the electric field to change the spatial position of the hydrogenous ions. The state of the memory element is determined by sensing the conductivity of either of the layers adjacent to the dielectric. If the hydrogenous ions have been moved next to the interface between the dielectric layer and the adjacent semiconducting layer, the positive electric field from the ions will attract electrons from the adjacent semiconducting layer to the interface thereby changing the conductivity. When realized with silicon dioxide as the dielectric layer, the memory element is nonvolatile. When other dielectric materials are employed, the memory element can be a nonvolatile memory or a DRAM that is radiation tolerant.

DETAILED DESCRIPTION OF THE INVENTION

The effects of hydrogen ions in microelectronic devices have been studied for some time. Metal-oxide-semiconductor (MOS) devices when exposed to ionizing radiation or hot carrier stress degrade due to the creation of electrically active defects at the oxide-semiconductor interface. Many studies suggest that ionic hydrogen plays a key role in this degradation. In the course of studying these problems, the inventors of U.S. patent application Ser. No. 08/714,547 made the important discovery of the hysteresis of the current-voltage (IV) characteristics in a dielectric layer containing such protons and surrounded by conducting or semiconducting layers. The initial discovery was made in the course of investigating the silicon-on-insulator (SOI) material system but has since been expanded to more conventional silicon processing systems.

Electronic Memory

Figure 1A:
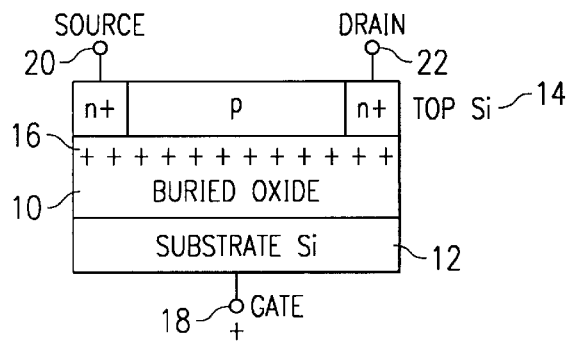
FIG. 1A is a cross sectional view of one embodiment of the electronic memory element formed as pseudo ($\Psi$) MOSFET with the hydrogenous ions at the upper boundary of the oxide layer.
Figure 1B:
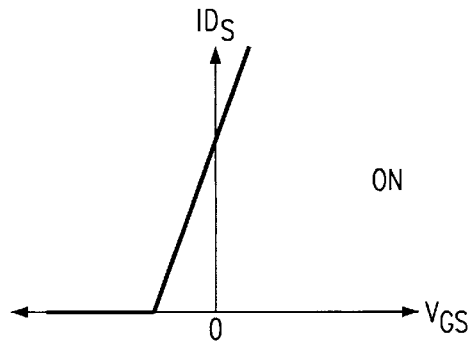
FIG. 1B is a simplified graph of the current voltage (I-V) characteristic of the element.
Figure 2A:
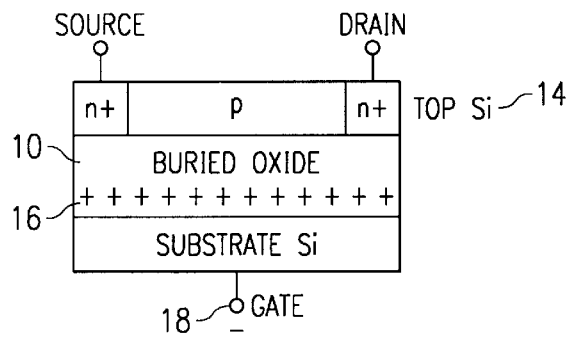
FIG. 2A is a cross sectional view of the embodiment of the electronic memory element shown in FIG. 1A with the hydrogenous ions at the lower boundary of the oxide layer.
Figure 2B:
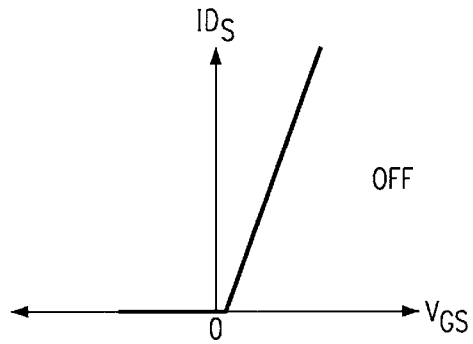
FIG. 2B is a simplified graph of the I-V characteristic of the element.

The mechanism embodied in an electronic memory is perhaps most readily understood by a study of FIGS. 1A, 1B, 2A and 2B. FIG. 1A is a simple embodiment of the electronic memory with the oxide layer 10 surrounded by the silicon substrate 12 below and the upper p-Si layer 14 above. A gate electrode 18 is attached to the bottom of the substrate, and source 20 and drain 22 electrodes are attached to n+ regions of the upper layer 14. The mobile hydrogenous ions 16 are at the top of the oxide layer. This spatial position of the ions produces the 'ON' condition shown in the simplified I-V curve in FIG. 1B. The presence of the positively charged ions 16 attracts the mobile electrons in the p region of the upper layer 14 to the interface between layers 10 and 14, thereby creating a conducting channel at the base of the upper layer 14 so that current will easily pass between the source and drain electrodes. FIG. 2A shows the same device with the hydrogenous ions 16 now moved to the bottom of the oxide layer 10. In this position the electric field created by the ions is no longer strong enough to create the conductive channel in the upper layer 14. This produces the 'OFF' condition shown in the I-V curve in FIG. 2B. The ions 16 are moved by placing the voltage biases shown on the gate electrode 18 as shown in FIGS. 1A and 2A. These devices could also be fabricated with p+ regions at the source and drain electrodes.

Figure 3A:
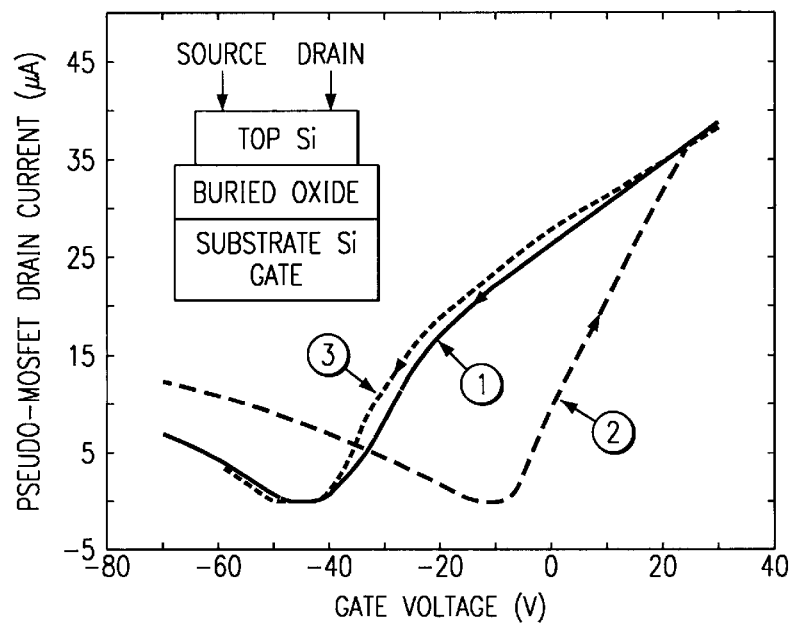
FIG. 3A is a graph of the I-V characteristic of SIMOX $\Psi$-MOSFET structure.
Figure 3B:
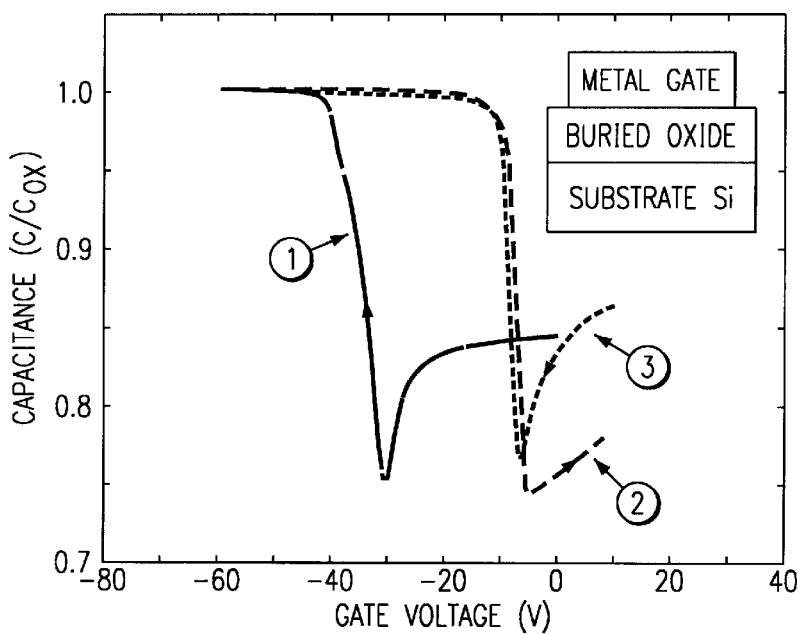
FIG. 3B is a graph of the C-V characteristic of an MOS capacitor, as shown in the respective inserts.

The initial devices created to demonstrate the invention were formed in Si—SiO$_2$/Si structures. H$^+$ (D$^+$) ions were introduced into the buried SiO$_2$ layer by annealing the structure in a hydrogen (deuterium) containing atmosphere. The spatial position of the ions in the oxide layer was measured by high frequency capacitance voltage and current voltage measurements (FIGS. 3A and 3B). The reversibility and transient behavior of the proton and deuteron migration inside the oxide layer was studied as a function of gate bias across the oxide at different temperatures and demonstrated that the ions created by the introduction of the hydrogenous gas were responsible for the hysteresis effects observed.

Three different types of Si/SiO$_2$/Si materials were originally investigated. Separation by the implantation of oxygen (SIMOX) samples were formed by implanting a p-type Si(100) substrate with 190-keV O$^+$ ions to a dose of 1.8×10$^{18}$ cm$^{-2}$ followed by a subsequent anneal at 1320° C. in Ar+1% O$_2$. This resulted in a 200-nm monocrystalline Si (c-Si) layer on top of a 400-nm buried oxide layer, so the oxide layer is sandwiched between two c-Si layers. Zone-melt-recrystallization (ZMR) SOI wafers, p-type (100) Si material, with a 330-nm monocrystalline Si layer on top of a 1-μm-thick buried oxide layer, were also investigated. Apart from these two SOI materials, we also studied a standard thermal SiO$_2$ (40-nm thick) capped with an undoped poly-Si layer (1-μm thick), chemical-vapor-deposited and annealed at 1200° C. for 2 hours in Ar+1% O$_2$.

Part of the top Si layer of the wafers was etched in a HNO$_3$—CH$_3$COOH—HF mixture through a mask, leaving behind isolated rectangular strips (2 mm by 9 mm) of top Si layer. This was done to reduce leakage currents at the substrate edges and through the buried oxide layer during the subsequent point contact pseudo-metal-oxide-semiconductor-field effect-transistor (Ψ-MOSFET) measurements.

Forming-gas (FG) [N2:H2; 95:5 or N2:D2; 95:5 (by volume, 99.999% pure)] and nitrogen (99.999% pure) anneal treatments were performed using a flow through a quartz tube inserted into a tube furnace between 300° C. and 900° C. for 30 min. At the end of the 30 minute anneal, the devices were quickly removed from the furnace and cooled to room temperature. For the capacitance-voltage (C-V) measurements, the Si strips were etched off using KOH. C-V measurements on the Si/SiO$_2$ structures resulting from the KOH etch were made at 1 MHz with a mercury probe or Al dots (≈1 mm$^2$ contact area) forming gate contacts. Current-voltage (I-V) measurements on the Si/SiO$_2$/Si structures were performed using the point-contact Ψ-MOSFET technique. The buried oxide plays the role of the gate dielectric and the top Si layer represents the transistor body. Two tips of a standard four point probe are placed on the top Si layer to form the source and drain point contacts, while the gate voltage is applied to the back of the Si substrate.

FIG. 3A shows the hysteretic behavior of the I-V curves on SIMOX after it received a 550° C. FG anneal. Similar features were observed in the ZMR and the poly-Si capped thermal oxide, and occurred over a FG-anneal temperature range from 500 to 800° C. Curve 1 was recorded with a decreasing gate (substrate) bias (from positive to negative) after the bias was kept constant at the initial value (+40 V) for 5 minutes. Curve 2 was subsequently recorded using the opposite gate voltage sweep direction (from negative to positive) after holding the gate bias at the initial value (−70 V) for 5 min. The "hysteretic" behavior is evidenced by the fact that the original I-V curve (curve 1) was not retraced by reversing the voltage sweep direction (curve 2). Curve 3 was recorded after curve 2 using the same procedure described for curve 1, showing the reversibility of the process.

In general, charge in the oxide will cause the I-V curve to shift along the voltage axis. This voltage shift (ΔV) or hysteresis voltage is proportional to the charge density and depends on its spatial distribution in the SiO$_2$ Layer:

$$\Delta V = -\frac{e}{\varepsilon} \int_0^d x \rho(x) dx \quad (1)$$

where e is the electronic charge, d is the oxide thickness, ε is the oxide dielectric constant, and ρ(x) is the local charge density in the dielectric. For the MOS capacitors, the variable "x" is the distance between the local oxide charge r(x) and the metal gate; for the Ψ-MOSFET, x is the distance between the charge and the substrate-Si/SiO$_2$ interface. As can be seen from the integral in Eq. 1, ΔV is maximized for the Ψ-MOSFET if the charge is located near the top-Si/SiO$_2$ interface (x≈d) and is minimized if it is located near the substrate-Si/SiO$_2$ interface (x≈0). The negative voltage shifts ΔV in the I-V plots are caused by positive charges in the buried SiO$_2$ (areal density≈2×10$^{12}$ cm$^2$). The observed hysteresis behavior is the result of an electric field induced migration of a charged ionic species from one Si/SiO$_2$ interface to the other. This type of behavior was not observed after annealing in Ar or N$_2$, showing that the presence of hydrogen in the anneal ambient triggers the hysteretic behavior; it is not due to mobile ion contamination.

If the top Si layer is removed and an MOS capacitor is formed, it is observed that the charge species escape the SiO$_2$ dielectric through the metal gate under negative gate bias. This further demonstrates that the mobile species involved are positively charged. The crucial role of the hydrogen/anneal step to trigger the hysteretic effect, and the much higher solubility of hydrogen and reaction in metal capacitor gates such as Al or Hg as compared to Si, collectively suggest that the mobile charge is H$^+$.

For an analysis of field induced charge migration effects, see K. Vanheusden, et al.'s article in the Apr. 10, 1987 issue of Nature, "Non-volatile memory device based on mobile protons in SiO2 thin films." This article discusses theoretical explanations for these effects. It also discusses experimental methods of exploring charge migrations in buried $SiO_2$ layers.

As discussed in the '547 application, this observed hysteretic behavior can be utilized in a non-volatile NVFET memory device. An n-channel transistor can be changed to "normally on" or "normally off" by applying a positive or negative gate (substrate) bias which will drift the protons to the top $Si/SiO_2$ or substrate $Si/SiO_2$ interface, respectively. For a memory device this can be interpreted as writing the device to a bit state "1" or "0", respectively. To read the device, the zero bias drain current $I_0$ is simply measured (high current then corresponds to logic state "1", low current to "0"), as visualized in FIGS. 1, 2, 3, and 4. In contrast with the instabilities that are usually associated with mobile ions in $SiO_2$, charge retention experiments on this device show that once written to a specific state, the device remains in that state for over $10^4$ s while heated to 200° C. Furthermore, fatigue experiments performed on these structures show that the device endures over $10^6$ write-erase cycles without any degradation.

Figure 7:
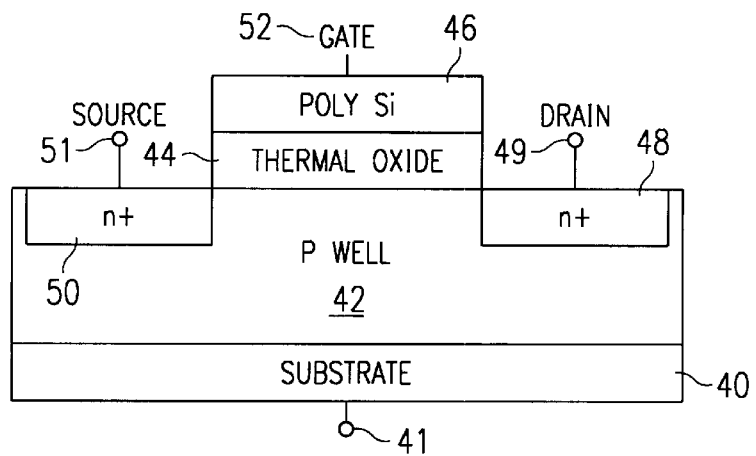
FIG. 7 is a cross sectional view of another embodiment of the electronic memory element, here an embedded memory element for use in conjunction with non-memory elements on the same silicon substrate.

For memory devices, a short write time is desirable. Vanheusden, et al.'s Nature article shows that the device speed is proportional to $d^{-3}$, where d is the buried oxide thickness. For devices fabricated using the poly-Si-capped 40-nm thermal oxide substrate as shown in FIG. 7, a write time of about 30 ms was observed at room temperature, in good agreement with the $d^{-3}$ dependence predicted from theory. Write times as fast as 1 ms can be expected for 10-nm thermal oxides. Even more significantly, the latter result demonstrates that these non-volatile field effect transistor (NVFET) memory devices do not require SOI substrates, but can be fabricated using thermal oxides capped with a poly-Si layer, a standard procedure in Si-MOS processing.

Figure 8:
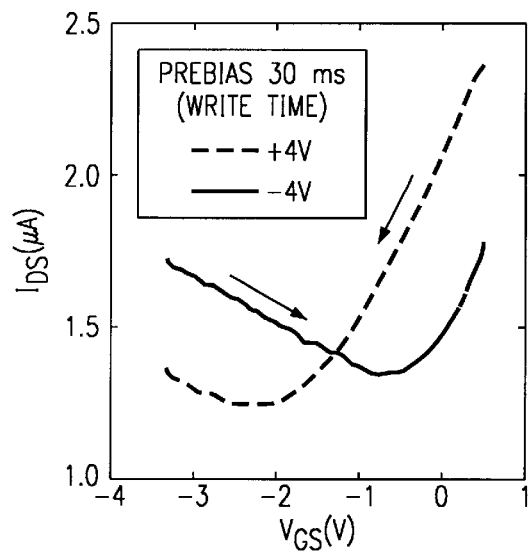
FIG. 8 is a graph of the measured I-V characteristic for the element of FIG. 7.

Turning to FIG. 7 for more detail on this alternative device, a p-type region 42 is formed on a silicon substrate 40. An oxide layer 44, which can be either a thermal oxide layer or a deposited oxide layer, is formed on top of the p-type layer 42 and capped by a polycrystalline silicon layer 46. The hydrogenous ions are introduced into the oxide layer at this point, either by annealing in a hydrogenous gas atmosphere ending in a rapid cooling or by ion implantation. The n+ drain 48 and source 50 regions are formed, and finally the various electrodes are formed. To write the device, substrate 41, source 51, and drain 49 electrodes could be connected to ground with the gate electrode 52 being biased positively or negatively to change the spatial position of the hydrogenous ions. FIG. 8 is a graph showing the I-V characteristic of the device of FIG. 7, where the ions were formed in the oxide layer by a 30 minute anneal at 550° C. in forming gas, where the anneal ended in a rapid cooling to room temperature. This device could also be fabricated in n-type Si with p+ regions about the source and drain electrodes.

Figure 4:
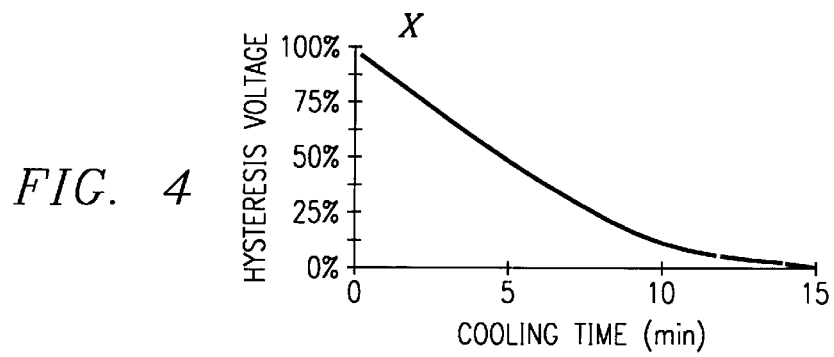
FIG. 4 shows the effect of cooling time on hysteresis voltage.

The devices discussed above were all cooled rapidly at the end of the forming gas anneal. We tested the effect of post FG anneal cooling rate by measuring capacitance versus voltage (see FIG. 3B) on a series of poly-silicon/thermal oxide/single crystal silicon test samples. These experiments showed that the degree of hysteresis is affected by how fast the device is cooled from the anneal temperature. FIG. 4 plots the hysteresis voltage versus the time taken to cool a device from a 600 degrees C. forming gas anneal to room temperature. FIG. 4 shows that of the devices tested, the greatest hysteresis voltage was obtained with a 15 second cooling time (quench). This cooling time translates into an approximately 2400 degrees C. per minute cooling rate ((600−25)/0.25). FIG. 4 shows that high hysteresis voltages were obtained with both 1200 and 600 degrees C. per minute cooling rates. However, even the 120 degrees C. per minute cooling rate provided a hysteresis voltage about half of this hysteresis voltage, while the 60 degrees C. per minute cooling rate provided a hysteresis voltage that is still about one eighth of the hysteresis voltage of the 15 second device.

The nature of this cooling rate relationship to hysteretic behavior is not well understood. However, one possible explanation is that there exists a minimum activation barrier to the formation of protons from molecular hydrogen. The formation of $H^+$ from the intermediate atomic hydrogen may be through a quick, reversible reaction. During slow cooling, the reaction is under thermodynamic control. Thus protons are converted back to atomic and molecular hydrogen. Under fast pull (rapid cooling) conditions, the reaction is under kinetic control. By rapidly cooling the system, the protons become confined within the boundaries of the buried oxide where they are free to move under an applied electric field.

The preceding experiment might imply that after the FG anneal, the device must be quickly cooled to room temperature. While this complete cooling provides excellent results, it is not always required. Instead, most devices need only to be quickly cooled down to an activation threshold temperature. Once a device is cooled below this temperature, further cooling (rapid or slow) makes little difference. This activation threshold temperature seems to be variable, depending upon processing history, as well as other factors. Sometimes, a sudden cooling to below 400 degrees C. will provide acceptable results. Sudden coolings to below 350 degrees C. often provide full hysteric behavior, while sudden coolings to below 300, or even 250 degrees C., provide additional confidence, with little additional burden.

Figure 5:
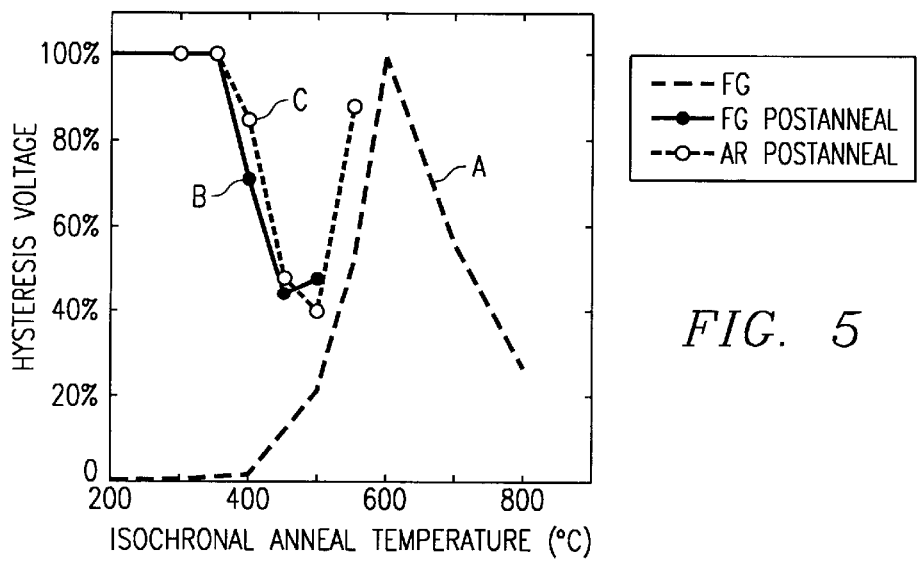
FIG. 5 shows how the hysteresis voltage varies with the forming gas anneal temperature.

The examples shown so far have used various annealing temperatures to provide the hysteresis effects. Curve A, the FG anneal curve, of FIG. 5 represents the hysteresis voltage of several devices, where each device was subjected to a 30 minute forming gas anneal at a different temperatures. Curve B, the FG post-anneal curve, of FIG. 5 represents the hysteresis voltage of several devices, where previously annealed devices were subjected to a second 30 minute forming gas anneal. Curve C, the argon post-anneal curve, of FIG. 5 represents the hysteresis voltage of several devices, where previously annealed devices were subjected to a 30 minute argon gas anneal. In these three series of experiments, each of these anneals terminated with a quench to room temperature. Curve A of FIG. 5 shows that, for 30 minute anneals of some device geometries, a 600 degrees C. annealing temperature gives the largest hysteresis voltage. This curve also shows that hysteresis effects start to occur with 400 degrees C. anneals, but that the more significant hysteresis voltages require anneals between 500 and 800 degrees C., with the best results being between 550 and 650 degrees C. Those skilled in the art will appreciate that different geometries, pre-processing conditions, or anneal times may somewhat shift the location of the peak of this curve.

Curves B and C, the two post-anneal curves, of FIG. 5 show that further processing below 350 degrees C. does not usually affect the hysteresis voltage of these devices. Curves B and C also seem to show that 30 minute anneals between 400 and 500 degrees C. tend to lower the hysteresis voltage.

One particularly interesting aspect of these devices is that reannealing at 550 to 650 degrees C., followed by a sudden cooling, will usually cause the devices to retain, or even regain, much or all of their hysteresis behavior. Although curve C of FIG. 5 shows only the data for a device reannealed in an inert atmosphere, this reactivation effect also occurs for devices reannealed in a hydrogenous atmosphere. For example, other experiments have shown that 5 minute FG anneals (with rapid cooling) at 400, 450, 475, or 500 degrees C. can reactivate hysteresis behavior of capacitors that have been metallized with aluminum. In these experiments, the 475 degrees C. anneal provided the largest hysteresis voltage, while the 450 and 500 degrees C. anneals gave slightly lower hysteresis voltages, but still greater than hysteresis voltage from the 400 degrees C. anneal. This reannealing provides a method to restore hysteresis properties to devices that have been activated, but have lost their hysteresis properties. This method even works after metallization. One typical hysteresis loss mechanism is further processing of the wafer at temperatures over 350 degrees C. As FIG. 5 shows, this reannealing does not always require a hydrogenous atmosphere. Thus, in some circumstances, reactivation can be performed even after the oxide layer with the mobile protons has been fully covered by other layers.

This NVFET device has potential advantages over state-of-the-art non-volatile memory technologies such as Flash and EEPROM. While its speed, retention and lifetime performance are certainly competitive with these existing technologies, it can be simpler in design, require fewer processing steps, and operate at much lower voltages.

Finally, we discuss the mechanism causing the incorporation of mobile $H^+$ ions in the buried $SiO_2$ layer of these $Si/SiO_2/Si$ materials during the FG anneal. It is known that the high-temperature (1200–1325° C.) formation anneal step created neutral O vacancies (Si—Si bonds) in the buried oxide via O out-diffusion from the $SiO_2$ into the top and substrate Si layers. Because these strained Si—Si bonds can act as $H_2$ cracking sites in the buried $SiO_2$, they are catalyst sites for the generation of protons at elevated temperature. Since the solubility of hydrogen species in c-Si is low, once formed, the $H^+$ is largely "imprisoned" in the buried $SiO_2$ layer, sandwiched between the two encapsulating Si layers, i.e., the interfaces form a diffusion barrier for hydrogen. While there seems to be a peculiar affinity between $SiO_2$ and the hydrogenous ions that provides the excellent characteristics for non-volatile memory, the scope of the invention is intended to encompass any material which provides similar behavior with hydrogenous ions.

These cracking sites form naturally by the high temperature annealing process as the O from the silicon dioxide structures in the oxide diffuses across to the pure silicon regions in the layers on either side. As the O migrates away, Si—Si bonds are created in the oxide layers that form the cracking sites. However, these Si—Si bonds may also be created deeper within the oxide layer by implanting Si ions into the oxide layer to form the cracking sites. Once the cracking sites have formed, one should avoid further prolonged long duration high temperature processing steps for the devices.

Figure 9:
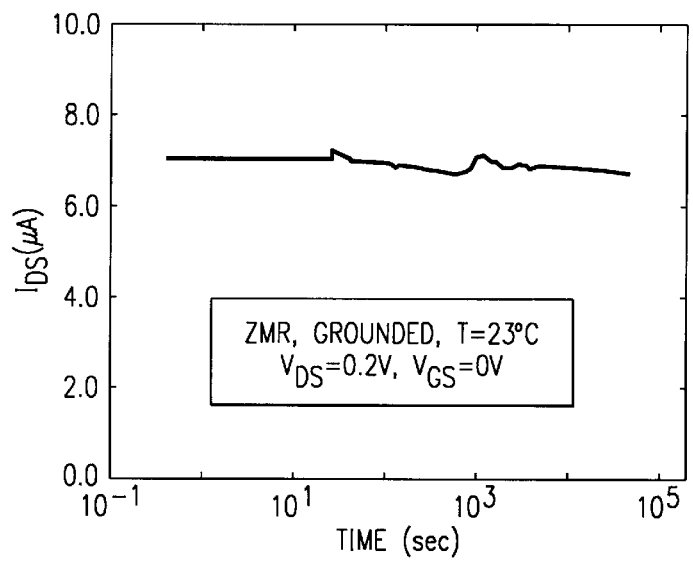
FIG. 9 is a graph showing the retention characteristic of the element of FIG. 7 at room temperature.
Figure 10:
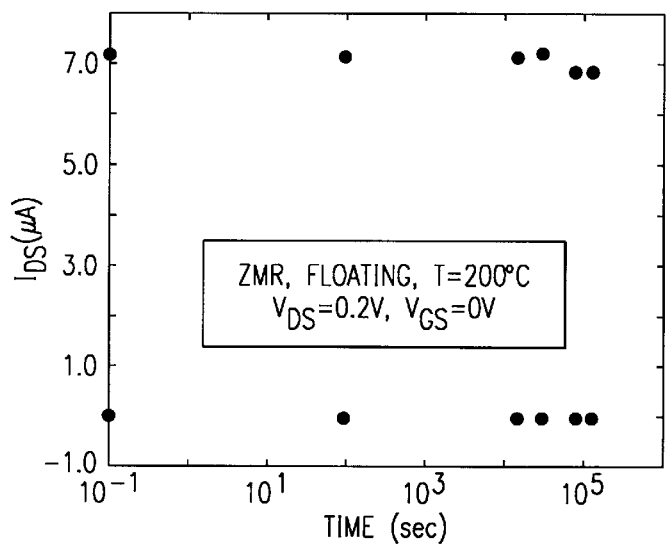
FIG. 10 is a graph showing the retention characteristic of the element of FIG. 7 at high temperature.

The silicon layers above and below are essentially impermeable to these ions. However, there may be some devices that require that a layer other than silicon be emplaced next to the central dielectric layer. This material must also act to confine the hydrogenous ions within the dielectric layer. Suitable materials for this barrier include, but are not limited to, nitrides, nitrided oxide, silicon nitride, and polycrystalline and monocrystalline silicon. Once the structure has been annealed and the ions created, the ions tend to remain within the oxide layer and gaps in the surrounding impervious confining material can be tolerated. FIGS. 9 and 10 illustrate the excellent retention characteristics of the silicon dioxide devices. If the barrier layer is also electrically conductive, e.g. doped silicon, this combined barrier/conductive region can also be used as an electrode, even though parts of this conductive region may extend to areas not adjacent to the dielectric with mobile hydrogenous ions.

Figure 6A:
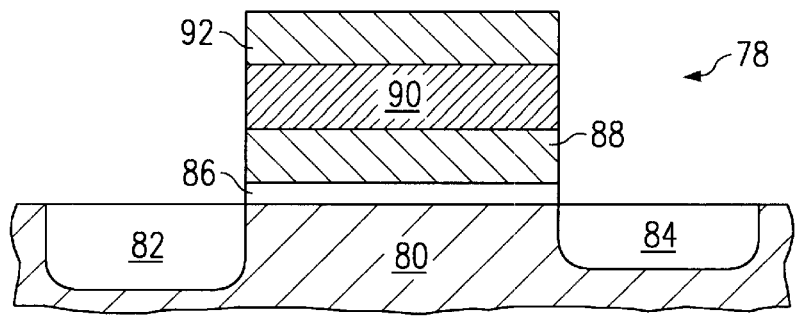
FIG. 6A shows a cross sectional view of an embodiment of a memory element with a floating gate.
Figure 6B:
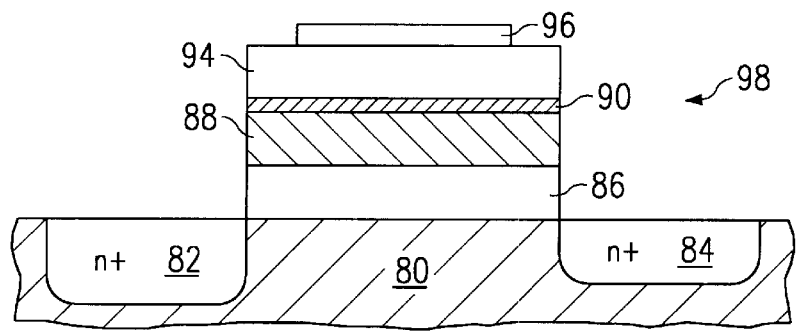
FIG. 6B shows a cross sectional view of an embodiment of another memory element with a floating gate.

FIGS. 9 and 10 show that these devices can exhibit excellent retention. However, under some circumstances, circuit designers may want further assurance that a protonic memory element not lose its charge state. In these cases, it may be desirable to use a floating gate structure. FIGS. 6A and 6B exemplify two such floating gate structures. FIG. 6A shows a protonic memory transistor 78 similar to the well-known flash memory MOS transistor. The substrate 80 contains source 82 and drain 84 regions. In this protonic memory element, the gate dielectric 86 contains mobile hydrogenous ions. This transistor also comprises a floating gate 88, an intergate dielectric 90, and a control gate 92. This transistor 78 programs similar to a flash memory cell. However, only a small image charge needs to be placed in floating gate 88. Additionally, in operation, the protons in gate dielectric 86 will cause transistor 78 to be maintained in either an "on" or an "off" state, even without a gate voltage applied. In this design, both the substrate 80 and floating gate 88 need to be formed from materials substantially impervious to hydrogen ions at room temperature, such as single crystal Si and polysilicon.

FIG. 6B shows another floating gate protonic memory transistor 98. It is similar to the FIG. 6A transistor, except that its control gate shows an optional split into a lower control gate 94 and an upper control gate 96. This allows the gate to be formed from two different materials, such as a polysilicon lower gate 94 and an aluminum upper gate 96. In this embodiment, the intergate dielectric 90 should be substantially thinner than the gate dielectric 86. This relative thinness allows easy electron tunneling between the floating gate and the control gate.

The above examples have discussed structures formed by SIMOX processing and conventional silicon MOS processing techniques. Other processes may be employed to form the memory elements including but not limited to zone melt recrystallization (ZMR), UNIBOND® processing, and bonded and etchback silicon on insulator (BESOI).

We claim:

1. A method for forming a microelectronic memory element, the method comprising:

forming a first dielectric layer to contain mobile hydrogenous ions between a lower barrier layer and an upper barrier layer, the barrier layers located on either side of the first dielectric layer and being substantially impervious to migration of hydrogenous ions therethrough; and populating the first dielectric layer with mobile charged hydrogenous ions;

wherein the populating step comprises annealing the first dielectric layer in an atmosphere comprising a hydrogenous gas, the anneal concluding with a sudden cooling of the first dielectric layer.

2. The method of claim 1, wherein the first dielectric layer comprises silicon dioxide, the silicon dioxide containing oxygen vacancies.

3. The method of claim 1, wherein the first dielectric layer's temperature during annealing is between 400 degrees C. and 800 degrees C.

4. The method of claim 1, wherein the first dielectric layer's temperature during annealing is approximately 600 degrees C.

5. The method of claim 1, wherein the first dielectric layer's temperature during annealing is between 450 degrees C. and 650 degrees C.

6. The method of claim 5, wherein the sudden cooling reduces the first dielectric layer's temperature to less than 350 degrees C.

7. The method of claim 5, wherein the sudden cooling reduces the first dielectric layer's temperature to less than 400 degrees C. at a cooling rate of at least 60 degrees C. per minute.

8. The method of claim 7, wherein the cooling rate is at least 120 degrees C. per minute.

9. The method of claim 7, wherein the cooling rate is at least 600 degrees C. per minute.

10. The method of claim 7, wherein the cooling rate is at least 1200 degrees C. per minute.

11. The method of claim 7, wherein the cooling rate is at least 2400 degrees C. per minute.

12. A method for forming a microelectronic memory element, the method comprising:

forming a first silicon dioxide layer containing oxygen vacancies between a lower barrier layer and an upper barrier layer, the barrier layers located on either side of the first layer and being substantially impervious to migration of hydrogenous ions therethrough; and populating the first dielectric layer with a hydrogenous species by annealing in a hydrogen-containing atmosphere;

activating the hydrogenous species to form mobile charged hydrogenous ions by post-annealing at a temperature between 400 degrees C. and 600 degrees C., the post-anneal concluding with a sudden cooling.

13. The method of claim 12, wherein the sudden cooling reduces the first dielectric layer's temperature to less than 350 degrees C.

14. The method of claim 12, wherein the sudden cooling reduces the first dielectric layer's temperature to less than 400 degrees C. at a cooling rate of at least 60 degrees C. per minute.

15. The method of claim 14, wherein the cooling rate is at least 600 degrees C. per minute.

* * * * *